United States Patent [19]

Yarranton et al.

[11] Patent Number: 4,639,697
[45] Date of Patent: Jan. 27, 1987

[54] TEMPERATURE COMPENSATION CIRCUITRY

[75] Inventors: Arthur Yarranton, Maynard; Charles E. Chase, Jr., Needham; Jean E. Picquendar, Wareham, all of Mass.

[73] Assignee: Raytheon Company, Lexington, Mass.

[21] Appl. No.: 650,019

[22] Filed: Sep. 13, 1984

[51] Int. Cl.[4] .................. H03H 9/42; H03H 9/68; H03B 5/32
[52] U.S. Cl. .................. 333/155; 310/313 R; 310/315; 331/107 A; 333/139; 333/193; 361/282
[58] Field of Search .................. 333/150–155, 333/193–196, 138–149, 156–164; 336/30, 179; 331/135, 176, 107 A, 65; 361/282; 310/313 R, 313 B, 313 C, 313 D, 313 A, 315

[56] References Cited

U.S. PATENT DOCUMENTS

| | | | |
|---|---|---|---|
| 1,706,172 | 3/1929 | Kinnard | 336/179 |
| 2,234,002 | 3/1941 | Harvey | 336/179 |
| 2,439,809 | 4/1948 | Hunter | 331/176 |
| 2,544,407 | 3/1951 | Westcott | 331/135 |
| 2,654,861 | 10/1953 | Khouri | 336/179 X |
| 2,669,699 | 2/1954 | Shapiro | 336/179 X |
| 2,935,704 | 5/1960 | Gordon et al. | 333/138 |
| 3,471,815 | 10/1969 | Grant et al. | 336/179 X |
| 3,774,089 | 11/1973 | Lewis | 361/282 |
| 3,813,946 | 6/1974 | Robbins, Jr. et al. | 73/430 |
| 4,338,575 | 7/1982 | Hartemann | 331/65 |

FOREIGN PATENT DOCUMENTS 104906 9/1938 Australia .................. 336/179

*Primary Examiner*—Marvin L. Nussbaum
*Attorney, Agent, or Firm*—D. G. Maloney; R. M. Sharkansky

[57] ABSTRACT

A surface acoustic wave (SAW) device provides a phase shift and a first predetermined phase shift variation as a function of temperature. A passive network including a passive, reactive component is thermally and electrically coupled to the SAW device. An electrical characteristic of the component has a predetermined variation as a function of the temperature of the reactive component which provides the network with a second, predetermined phase variation as a function of temperature to compensate for the first predetermined phase variation as a function of temperature provided from the surface acoustic wave device. With this arrangement, the phase shift provided from the surface acoustic wave device is substantially invariant with temperature.

47 Claims, 15 Drawing Figures

TEMPERATURE COMPENSATION CIRCUITRY

BACKGROUND OF THE INVENTION

This invention relates generally to temperature compensation circuitry and, more particularly, to temperature compensation of surface acoustic wave devices.

As is known in the art, components generally have a characteristic which varies with temperature. As is also known, surface acoustic wave devices (SAW devices) are used in a variety of applications such as a delay element for oscillator circuits. SAW devices may be fabricated as a delay line or resonator, for example, for use in such oscillators, as well as filters and pressure transducers. Generally, a SAW device includes a pair of transducers, with each transducer having a set of conductive members which are disposed on a common piezoelectric substrate. At least the surface of said substrate supports surface wave propagation. As a delay line, for example, an electrical signal is coupled to a first one of the transducers and in response to such signal, surface waves are launched. These surface waves propagate along the surface of the piezoelectric substrate and are received by the second one of the transducers. At this second transducer an electrical signal, a replica of the original signal, is produced in response to such surface waves. The time between launching of the surface waves at the first transducer and arrival at the second transducer provides a predetermined delay. When a SAW device is used in an oscillator application, the SAW device is generally used as the delay element in a feedback loop of an amplifier. The SAW device therefore provides the requisite phase shift characteristics to an input signal fed to the input of the amplifier. Thus, if the gain of the amplifier is greater than the losses in the feedback loop, and the input signal is in phase with respect to the output signal, then positive feedback is provided around the amplifier and the amplifier will oscillate at the frequency for which the input signal is in phase with the output signal. Also commonly disposed in the feedback loop of the amplifier is a variable phase shifter. The variable phase shifter, in response to an input control signal, provides an output signal having a predetermined phase variation with respect to the phase of an input signal. One type of variable phase shifter commonly employed in SAW oscillators is a varactor diode coupled in series with an inductor. A control bias signal is fed to the varactor diode to vary its capacitance and hence the phase characteristic of the variable phase shifter.

In many applications for SAW devices, particularly with respect to applications involving oscillators, the SAW device is used because it is a relatively stable delay element. Many different types of piezoelectric materials may be employed with SAW devices. However, since the surface wave velocity characteristic of the piezoelectric material as well as the propagation length between the transducers generally vary as a function of variations in the temperature of the material, the phase shift or delay characteristic of the SAW device will also vary with temperature. One of the most common types of substrate materials employed with SAW devices is ST or rotated ST-cuts of quartz. ST or rotated ST-cuts of quartz have a temperature dependent delay characteristic which is substantially parabolic. That is, over temperatures less than the so-called "turn-over temperature" of the ST or rotated ST-cuts of quartz, the delay characteristic or phase shift decreases with increasing temperature, and at temperatures greater than the turn-over temperature of the substrate material the delay characteristics or phase shift increases with increasing temperatures.

In highly stable precision oscillator applications, it is generally required to compensate for these temperature dependent changes in the surface wave velocity and propagation length of the SAW device and hence for changes in the delay or frequency characteristics of the SAW device. Otherwise, if left uncompensated, these temperature dependent variations will cause a concomitant change in the resonant frequency of the oscillator.

One type of temperature compensation scheme commonly used in oscillators employing SAW devices as delay elements involves parametric compensation of the phase of the input signal fed, via the feedback loop, to the input of the amplifier. More particularly, an active device such as a thermocouple is used to sense the temperature of the SAW device substrate (or piezoelectric material). A signal is generated from the thermocouple which is representative of the sensed temperature and this signal is then fed to an analog multiplier or a set of parametric amplifiers which provide, in response to the temperature sensor signal, an output signal having an amplitude which varies in a predetermined manner as a function of temperature. For example, in order to compensate a SAW device fabricated on ST-cut or rotated ST-cut quartz, the output signal from the multiplier will provide a signal having a quasiparabolic amplitude characteristic. This output signal provides the control signal which is fed to the varactor diode portion of the variable phase shifter described above. In response to this control signal, the capacitance of the varactor diode varies to provide, in combination with the series inductor, a phase shift characteristic which varies oppositely with respect to the phase variation generated by the temperature dependence of the SAW device. Thus, with this arrangement, the frequency of the oscillator is relatively stable with respect to temperature. This solution, however, presents several problems. The temperature compensation circuitry, that is, the active temperature sensor and the analog multiplier or parametric amplifiers increase the weight, size, power consumption, cost and circuit complexity of the oscillator. Also, due to the presence of these extra components, the reliability of the oscillator may be reduced.

SUMMARY OF THE INVENTION

In accordance with the present invention, an input signal is fed to a first device which provides a device output signal having a predetermined nominal phase shift relative to the phase of the input signal and a predetermined phase shift variation as a function of temperature. A compensating network is provided to reduce the temperature dependent phase shift variation of the device output signal. The compensating network includes at least one passive element having an electrical characteristic which varies in a predetermined manner as a function of the temperature of the passive element. The variation of the electrical characteristic is selected to provide the compensating network with a phase shift characteristic which varies with temperature such that a temperature compensated output signal is provided having a phase shift which is substantially invariant with changes in temperature. With this arrangement, the temperature compensated output signal has a phase shift characteristic relative to the input signal which is substantially invariant with changes in temperature. Since the compensation network provides the compensating phase shift characteristic in response to temperature-produced changes in the electrical characteristic of the passive element, the complex circuitry generally used for temperature dependent phase shift compensation is eliminated. Therefore, with this arrangement, the cost, size, complexity, power consumption and weight of the circuit are reduced.

In accordance with an additional aspect of the present invention, a surface wave device has a predetermined surface wave velocity variation and a predetermined propagation length variation as a function of temperature. A signal is provided in response to the surface wave velocity and propagation length variation having an electrical characteristic which varies as a function of variations in said surface wave velocity. The surface wave device is thermally and electrically coupled to a compensating network. The compensating network includes a passive reactive component having a predetermined temperature dependent reactance variation as a function of the temperature of the passive reactive component to compensate for the variations in the electrical characteristic resulting from the temperature-produced surface wave velocity variation and propagation length variation provided from the surface wave device. With this arrangement, a signal is provided with a temperature compensated electrical characteristic which is substantially invariant with temperature.

In accordance with an additional aspect of the present invention, an oscillator includes: means for producing a first signal having a predetermined amplitude; feedback means, disposed around the amplitude signal means, said feedback means including means, fed by said first signal, for providing said first signal with a predetermined phase shift and a predetermined phase shift variation as a function of temperature, and means, thermally and electrically coupled to said phase shift means, including at least one passive reactive element having a predetermined reactance variation as a function of the temperature of the passive reactive component, for providing a compensated signal to said amplitude means having a phase shift with respect to said first signal which is substantially invariant with temperature. With this arrangement, an oscillator is provided having a frequency which is substantially invariant with changes in temperature.

In accordance with an additional aspect of the present invention, a phase shift device having a first predetermined phase shift variation with respect to temperature is thermally and electrically coupled to a phase compensating network. The phase compensation network includes an inductor, having a coiled wire disposed around a magnetic member which is connected in series with a capacitor. The capacitor has a capacitance variation which is substantially invariant with temperature. The magnetic permeability characteristic of the magnetic member is selected to provide the inductor with a predetermined inductance variation with respect to variations in the temperature of the inductor and thereby to provide, in combination with the capacitor, a network having a second predetermined phase shift variation with respect to temperature. With this arrangement, the temperature dependent phase variation may be selected in accordance with the phase shift variation provided by the phase shift means, to thereby provide a phase shifter having a phase shift characteristic which is substantially invariant with changes in temperature.

In accordance with a further aspect of the present invention, a composite inductor element includes a pair of solenoids connected in parallel and a magnetic member disposed within portions of the magnetic field provided by said solenoids. The magnetic member is provided in a cooperative relationship with a nonmagnetic member. The nonmagnetic member axially displaces the magnetic member within regions of each of the solenoids in accordance with changes in temperature. The magnetic member is displaced within portions of the magnetic field regions provided by each of said solenoids such that the inductance of a first one of said solenoids increases linearly as a function of temperature, while concomitant therewith, the inductance of a second one of said pair of solenoids decreases linearly as a function of temperature. With this arrangement, by connecting said solenoids in parallel, an inductor element is provided having an inductance which varies parabolically as a function of temperature. This composite inductor may then be connected with a capacitor having a capacitance which is substantially invariant with temperature to provide a network having a phase shift variation as a function of temperature which is substantially parabolic. This network may be used to compensate for temperature dependent parabolic phase shift variations.

In accordance with a further aspect of the present invention, a composite capacitor element includes a center conductive member, and a pair of mutually spaced conductive members, each being dielectrically spaced from said center conductive member, with each member being arranged to be capacitively coupled to portions of the center conductive member. The center conductive member is provided in a cooperative relationship with means for axially displacing, as a linear function of the temperature of the composite capacitor element, the center conductive member with respect to the pair of spaced conductive members. The center conductive member dielectrically spaced from the pair of mutually spaced conductive members provides, in combination, a pair of series connected capacitors. Therefore, in accordance with changes in the temperature of the composite capacitor element, the first one of the pair of capacitors will have a capacitance which increases linearly with temperature, whereas, the second one of the pair of capacitors will have a capacitance which decreases linearly with temperature. With this arrangement, the composite capacitor element is provided having a change in capacitance as a function of temperature which is parabolic. This capacitor may then be used with an inductor having an inductance which is substantially invariant with temperature to provide a network having a phase shift which varies substantially parabolically as a function of temperature. This network may then be used to compensate for temperature dependent parabolic phase shift variations.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
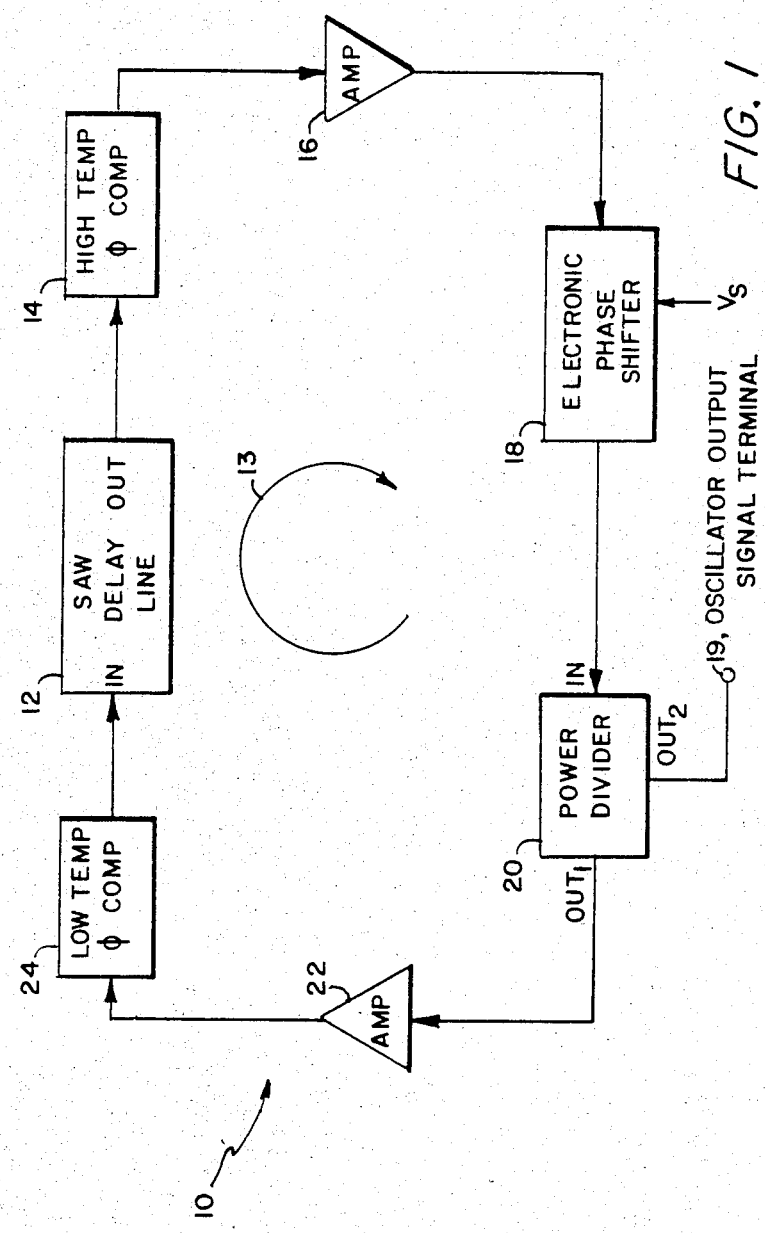
FIG. 1 is a block diagram showing a SAW delay line used as a delay element in an oscillator circuit.

Referring now to FIG. 1, an oscillator circuit 10 is shown to include a SAW device, here a SAW delay line 12 having a piezoelectric substrate (not shown) which supports surface wave propagation, a high temperature phase compensation network 14, here for phase compensation at temperatures greater than the turn-over temperature of the piezoelectric substrate of the SAW device, a first amplifier 16, an electronic phase shifter 18, a power divider 20, a second amplifier 22 and a low temperature phase compensation network 24, here for phase compensation at temperatures less than the turn-over temperature of the piezoelectric substrate. The SAW delay line 12 is used in a feedback loop denoted by arrow 13 around amplifiers 16 and 22 to provide the requisite phase shift characteristics to the signal propagating in the feedback loop. The output of the SAW delay line 12, therefore, is coupled to the high temperature phase compensation network 14 as will be described in conjunction with FIG. 2. The output of phase network 14 is coupled to the input of amplifier 16. Amplifier 16 is biased to provide an output signal having a predetermined amount of gain. The output signal from amplifier 16 is fed to an electronic phase shifter 18. Electronic phase shifter 18 is used to electronically fine tune the frequency of the oscillator 10 over a predetermined bandwidth. The output of the electronic phase shifter 18 is coupled to a power divider 20, here a center tapped transformer. Other types of power dividers may alternatively be used, such as a microstrip type power divider. The power divider divides an input signal at terminal "IN" into a pair of here equal amplitude and opposite phase output signals at terminals OUT 1, OUT 2. A first out-of-phase output signal is fed to an oscillator output signal terminal 19 (at OUT 1) and the second in-phase output signal (at OUT 2) is fed to the input of amplifier 22. Amplifier 22 is also biased to provide a predetermined amount of gain to the network 10. The output of amplifier 22 is coupled to a low temperature phase compensation network 24. Low temperature phase compensation network 24 is coupled to the input of the delay line 12.

SAW delay line 12 provides a substantially major portion of the phase delay characteristics in the oscillator circuit 10. Amplifier 16 and amplifier 22 are selected to provide a sufficient amount of gain in the feedback loop such that the composite gain of amplifiers 16, 24 exceeds the losses in the feedback loop. With proper phase characteristics at each input being substantially provided by the delay line 12 and the electronic phase shifter 18, positive feedback to amplifiers 16 and 22 is provided and, as a result, sustained oscillations are provided by the oscillator 10, with the electronic phase shifter 18 providing a relatively small, variable phase shift characteristic. The SAW delay line 12 provides relatively stable frequency characteristics to the oscillator 10 thereby providing a relatively stable, high precision output frequency from oscillator 10.

As is known, a SAW device, such as the SAW delay line 12, is fabricated on a piezoelectric substrate having a surface which supports surface wave propagation. As is also known, surface wave velocity and propagation length characteristics of the piezoelectric substrate vary as a function of temperature. These variations cause in delay lines variations in the delay characteristics of the SAW delay line 12. SAW delay line 12 is here fabricated on a substrate comprised of ST-cut or rotated ST-cut quartz. As is known in the art, ST-cut or rotated ST-cut quartz have surface wave velocity and propagation length characteristics which vary nonlinearly, more particularly, substantially parabolically with temperature. Over a range of approximately −50° to +70°, for example, this composite temperature variation may be as high as 150 parts per million. As is also known, for ST and rotated ST cuts of quartz, there is a temperature which is a function of the cut angle, where the rate of change of delay characteristics or phase shift is zero. For temperature less than this so-called "turn-over temperature," the delay or phase shift characteristic is a decreasing function of temperature. Conversely, for temperatures greater than the turn-over temperature, the delay or phase shift characteristis is an increasing function of temperature.

Networks 14 and 24, here passive element networks, are used to provide a predetermined temperature dependent phase shift variation to compensate for the surface wave velocity variations of the substrate of the SAW delay line 12. Here, since the SAW delay line 12 is comprised of ST or rotated ST-cut quartz, networks 14, 24 in combination provide a nonlinear, more particularly, a quasi-parabolic phase shift vs. temperature characteristic to the signal in the feedback loop. The SAW delay line 12 in combination with these phase compensation networks 14, 24 therefore provides a substantially invariant phase shift characteristic as a function of temperature through the feedback loop of the oscillator 10. Thus, the output frequency of the oscillator 10 will also be substantially invariant with temperature.

In the embodiment shown in FIG. 1, two amplifiers are required to provide sufficient gain in the loop, and sufficient output power from the oscillator. As is known in the art, SAW delay lines have a relatively high insertion loss, generally of the order of 10–20 db. Also, the phase compensation networks 14, 24, power divider 20 and electronic phase shifter 11 also have a predetermined insertion loss. It is also known in the art that at relatively high frequencies, the amount of gain which may be provided from a single conventional field effect transistor, for example, is limited to about 12 to 14 db. For the SAW delay line 12 which has a relatively high insertion loss, and where as here half of the power is coupled from the oscillator 10 to the output terminal 19, the pair of amplifiers 16, 22 are provided. However, other SAW devices, such as SAW resonators having a relatively lower insertion loss or with other coupling arrangements, one of the aforesaid amplifiers may be eliminated. Such an embodiment is shown and described hereinafter in conjunction with FIG. 7.

Figure 2:
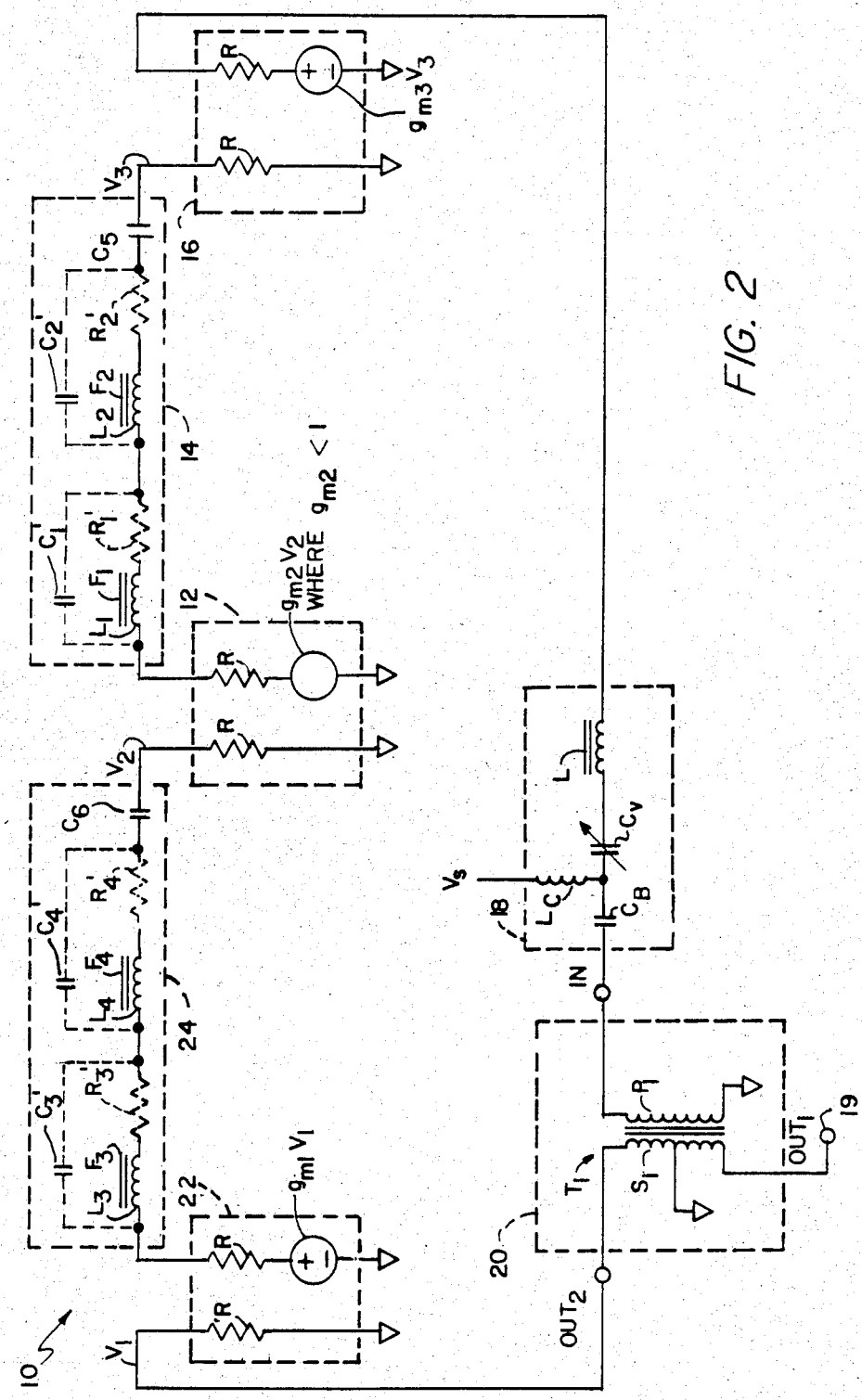
FIG. 2 is an equivalent circuit schematic diagram of the oscillator circuit of FIG. 1 in accordance with a preferred embodiment of the invention.

Referring now to FIG. 2, the equivalent circuit of the oscillator circuit 10 (FIG. 1) is shown to include the pair of phase shift networks 14 and 24, each one of said networks 14, 16 being coupled between a corresponding one of amplifiers 16, 22 and the SAW device 12. It is assumed here that the input impedance of the amplifiers 16, 24 may be represented as a real resistance R, and the output impedance of the amplifiers 16, 24 may also be represented as a real resistance R in series with a voltage source $g_{m1}V_1$ and $g_{m3}V_3$, respectively. Similarly, the input impedance of the SAW delay line may be represented by a real resistance R, and the output impedance of the SAW delay line may also be represented by a real resistance R in series with a voltage source $g_{m2}V_2$ where $g_{m2} < 1$.

High temperature phase shift compensation network 14 is here shown to include a pair of inductors $L_1$ and $L_2$ connected in series with a conventional chip capacitor $C_5$ having a low and substantially linear capacitance variation as a function of temperature. The equivalent circuit of each inductor $L_1$, $L_2$ includes, respectively, a corresponding parasitic capacitance $C_1'$, $C_2'$, and a corresponding parasitic resistance $R_1'$, $R_2'$. Each inductor $L_1$, $L_2$ also includes a corresponding magnetic member $F_1$, $F_2$, respectively.

In accordance with one aspect of the invention, the magnetic permeability characteristic ($\mu$) of the magnetic members $F_1$, $F_2$ is selected to provide a predetermined inductance variation with respect to temperature for the inductors $L_1$ and $L_2$, and to thereby provide the network 14 with a corresponding predetermined phase variation with respect to the temperature of the inductors $L_1$, $L_2$. Here the inductance variation of inductors $L_1$ and $L_2$ is chosen such that the inductance will decrease with increasing temperatures over a range of temperatures, of the SAW delay line 12 and inductors $L_1$, $L_2$, greater than the turn-over temperature of the piezoelectric substrate of SAW delay line 12, and will be substantially invariant with temperature at temperatures of the SAW delay line 12 and inductors $L_1$, $L_2$ which are less than the turn-over temperature. Since $l \alpha \mu$, that is, the inductance is proportional to the permeability, the permeability of ferrite member $F_1$ is selected to have the abovedescribed qualitative variation as a function of temperature. Therefore, the network 14 will provide a phase shift to a signal which decreases with increasing temperature of the SAW delay line 12 and inductors $L_1$, $L_2$ for temperatures greater than the turn-over temperature of the piezoelectric surface wave propagation material of the SAW delay line 12 and is substantially invariant with changes in temperature for those temperatures less than the turn-over temperature of the piezoelectric material.

Figure 3:
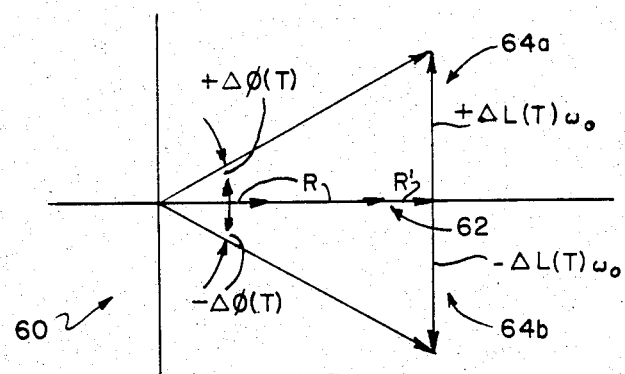
FIG. 3 is a phasor representation useful in understanding the present invention.

The transfer function relating the output voltage $g_{m2}V_2$ of the SAW delay line 12 to the input voltage $V_3$ at amplifier 16 may be represented by the following equation:

Equation (1)

$$(V_3/g_m V_2) = R/(2R + R' + j(\omega_o L - 1/\omega_o C))$$

where $R_1' + R_2' = R'$ $$j\omega_o L_1 + j\omega_o L_2 = j\omega_o L$$

and for resonance $\left(\omega_o L - \dfrac{1}{\omega_o C}\right) = 0$ or $\omega_o L = \dfrac{1}{\omega_o C}$ Referring to FIG. 3, a phasor diagram 60 representative of Equation (1) is shown for the resonance condition 62 where $$\omega_o L - \dfrac{1}{\omega_o C} = 0.$$

The phase angle $\phi$ provided by such a network is given by:

$$\phi = \tan^{-1}((\omega_o L - 1/\omega_o C)/(2R + R_1'))$$ Equation (2)

At resonance $(\omega_o L - 1/\omega_o C) = 0$, $\phi = \tan^{-1}(0)$, and $\phi$ is thus equal to zero. However, if the inductance ($L_{eq}$) of each inductor $L_1$, $L_2$ is allowed to vary in accordance with temperature $L_{eq} = (L + \Delta L(T))$, then the phase angle $\phi$ as represented in the diagram will have a value given by:

$$\phi = \tan^{-1}[(\omega_o(L + \Delta L(T)) - 1/\omega_o C)/(2R + R_1')],$$

if $(\omega_o L - 1/\omega_o C) = 0$, then $\phi = \tan^{-1}[\omega_o(T)L/(2R + R_1')]$ as represented by lines 64a, 64b. Therefore, if $\omega_o L(T)$ varies such that $\phi$ varies with temperature in the manner described above, then the resonance frequency $\omega_o$ of the oscillator 10 will be substantially invariant with changes in temperature for temperatures greater than the turn-over temperature of the material of the delay line 12.

Here the magnetic permeability temperature variation characteristics of the magnetic members $F_1$, $F_2$ is chosen such that the magnetic permeability of members $F_1$, $F_2$ will decrease with temperatures of the inductors $L_1$, $L_2$ which are greater than the turn-over temperature, and will be substantially invariant with temperatures of the inductors $L_1$, $L_2$ which are less than the turn-over temperature. Phase shift network 14 provides the phase compensation in the oscillator 10 for the high temperature range, that is, for temperatures greater than the turn-over temperature of the material of the SAW device. A material here selected to provide inductors $L_1$ and $L_2$ with such a temperature variation is a nickel-aluminum ferrite having an initial permeability at 1 KHz of 23 and a Curie Point temperature of 120° C. One example of such material is "TT2-113" which may be obtained from Trans-Tech Inc., Adamstown, Md.

Similarly, phase shift network 24 comprises a pair of inductors $L_3$ and $L_4$, each having respective magnetic members $F_3$ and $F_4$, said magnetic members having magnetic permeability characteristics selected to provide a predetermined inductance variation as a function of temperature of the inductors $L_3$, $L_4$ and therefore to provide in combination with the capacitor $C_6$, a predetermined phase shift variation as a function of temperature. Network 24 here provides the requisite phase shift variation compensation for the oscillator 10 over a range of temperatures less than the turn-over temperature of the piezoelectric material of the SAW delay line 12. A similar analysis may be carried out for network 24, the low temperature phase shift compensation network, as described for network 14. Here, inductors $L_3$, $L_4$ comprise magnetic members $F_3$, $F_4$, each member comprised of a magnetic material having a magnetic permeability characteristic such that inductance will increase as a function of increasing temperature for temperatures less than the turn-over temperature of the piezoelectric material, and the inductance will be substantially invariant with changes in temperature for temperatures greater than the turn-over temperature. Here magnetic members $F_3$ and $F_4$ are comprised of gadolinium doped yttrium-iron garnet having an initial permeability at 1 KHz of 26 and a Curie Point temperature of 280° C. One example of such a material is "G1005" garnet which may be obtained from Trans Tech Inc., Adamstown, Md.

Phase shift network 14 and phase shift network 24 in combination provide a predetermined phase shift variation as a function of temperature to compensate for the phase shift variation provided by the temperature dependence of the SAW delay line 12. Here in accordance with the temperature dependent delay characteristic of the ST-cut quartz, the networks 14 and 24 provide a predetermined composite phase shift characteristic which is here nonlinear and, more particularly, substantially quasi-parabolic.

Figure 4:
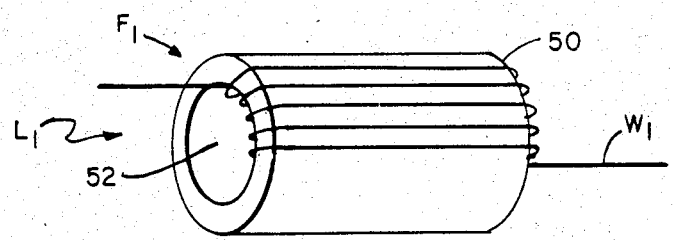
FIG. 4 is an isometric view of one embodiment of an inductor used in accordance with the present invention.

Referring now to FIG. 4, inductor $L_1$ is shown to typically include a predetermined number of turns, here five turns of a No. 38 insulated copper wire $W_1$ are shown wound around the magnetic member $F_1$. Ferrite member $F_1$ is here a cylinder 50 having a center hole or bore 52, and is comprised of the respective magnetic material, TT2-113 for inductors $L_1$, $L_2$ of the high temperature compensation circuit, and G1005 for inductors $L_3$, $L_4$ of the low temperature compensation circuit. Capacitors $C_5$ and $C_6$, here conventional ceramic chip type capacitors, are here selected to have a capacitance variation which is substantially invariant with temperature, with any variation being linear as a function of temperature. The actual values of the inductors $L_1$, $L_2$ and capacitor $C_5$, for example, are selected in accordance with the resonant frequency of the oscillator, as mentioned above. The change in inductance with temperature is selected in accordance with required compensating phase shift change. Here a pair of inductors $L_1$, $L_2$ and $L_3$, $L_4$ are used to minimize the corresponding parasitic capacitance $C_1'$ to $C_4'$.

The remainder of the oscillator circuit 10 includes the electronic phase shift network 18 here including a varactor diode denoted in FIG. 2 as a variable capacitor $C_v$ and an inductor L having a predetermined inductance. A blocking capacitor $C_b$ and a choke $L_c$ are respectively provided to isolate the d.c. bias from the oscillator, and the r.f. signal from the bias source. A voltage bias signal is fed to the varactor diode $C_v$ via choke $L_c$ to change the value of the capacitance of the varactor diode and to therefore change the phase shift of the LC network provided by network 18. With this arrangement, the resonant frequency of the oscillator 10 may be adjusted over a predetermined bandwidth of typically ±0.5 MHz. The output of the network 18' is coupled to the primary side of here a center tapped transformer $T_1$. The secondary side of transformer $T_1$ is center tapped to a reference potential. A first end of the secondary side is coupled to the input of amplifier 22', and a second end is coupled to output terminal 19 of the oscillator 10. Here the power divider ratio is selected such that half the power is fed to the amplifier 22' and half the power is fed to output terminal 19.

Figure 5:
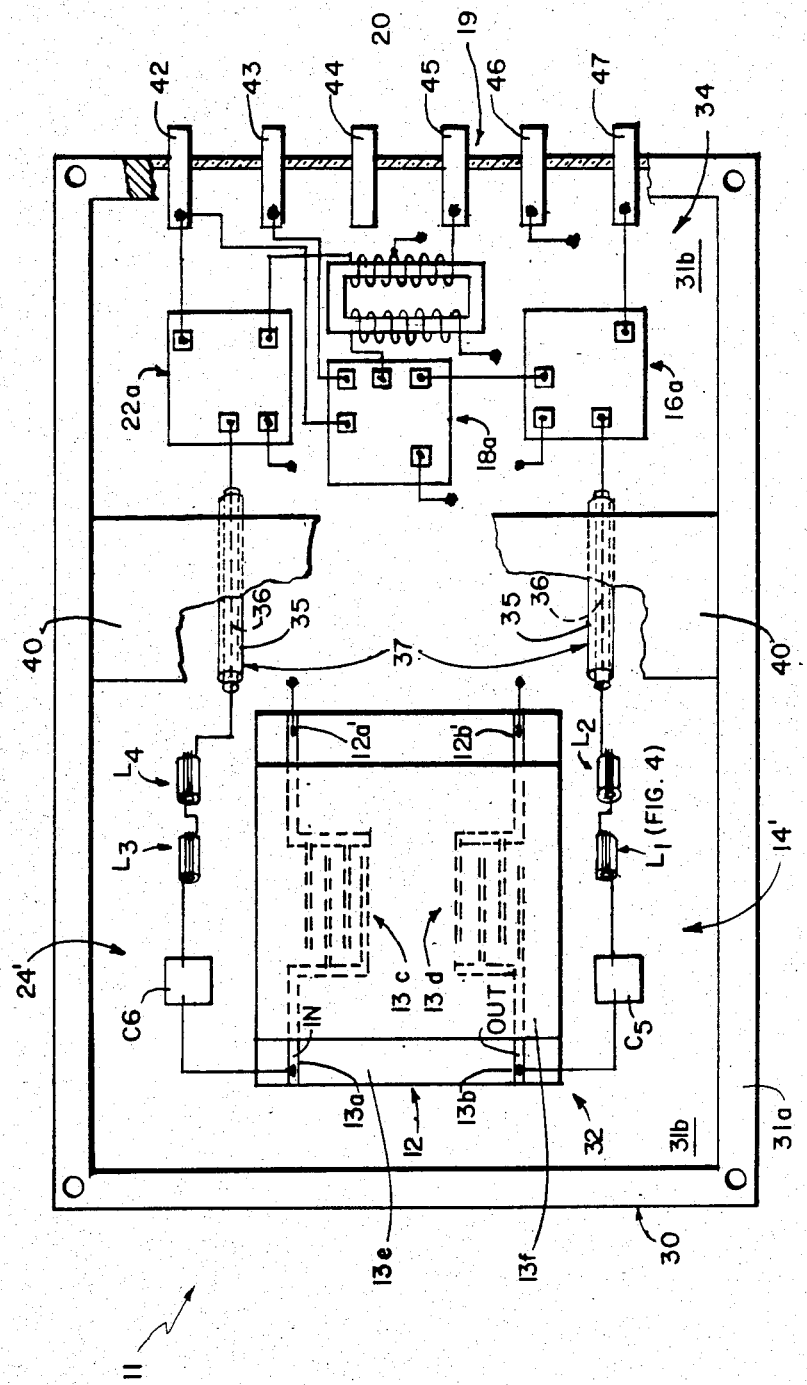
FIG. 5 is a diagrammatical plan view of an oscillator circuit of FIG. 2 packaged in a hybrid microelectronic circuit package.

Referring now to FIG. 5, the oscillator circuit 10 of FIG. 2 is here shown as a hybrid microelectronic circuit 11. The microelectronic circuit 11 is here shown to include a conductive package 30 having conductive sidewalls 31a, a conductive ground plane surface 31b, a first compartment 32 and a second compartment 34, disposed side by side. Alternatively, the package may include a pair of back to back compartments. Disposed in the first compartment 32 is a packaged SAW delay line 12 having two pairs of exposed bus bars 13a, 13a', 13b, 13b' which are coupled to transducers 13c and 13d which are disposed on a piezoelectric, here ST-cut quartz substrate 13e. The packaged SAW delay line 12 comprises an all quartz package having a glass frit seal between the quartz substrate 13e and a matching quartz cover 13f. However, other packages for SAW devices may alternatively be used. The compartment 32 of the package 30 also has disposed therein adjacent transducer 13d, the phase shift network 14, here including inductors $L_1$, $L_2$ and capacitor $C_5$, as described in conjunction with FIGS. 1–4. Compartment 32 further has disposed therein adjacent transducer 13c the phase shift network 24 here including inductors $L_3$ and $L_4$ and capacitor $C_6$, as described in conjunction with FIGS. 1–4. Here the temperature compensation phase shift networks 14 and 24 are located substantially close to and in substantially the same thermal environment as the SAW delay line 12. The phase shift networks 14 and 24 are coupled to corresponding amplifiers 16a and 22a through coaxial transmission line feedthroughs. As is known, coaxial transmission line feedthroughs 37 are provided through a center conductive member 40 of the package 30 which provides the separate compartment 32, 34, as shown. Each coaxial transmission line feedthrough 37 includes a center conductor 36 spaced by a dielectric 35 from an outer conductor, here the adjacent portion of the center conductive member 40 of the conductive package 30. The second compartment 34 of package 30 is shown to include a plurality of here three conventional hybrid circuit boards 16, 18 and 22, each one of said circuit boards including the associated electronics of amplifiers 16 and 22, and the electronic phase shift network 18, as described in conjunction with FIG. 2. Also provided in compartment 34 is the power divider, here transformer 20 as described in conjunction with FIG. 2. Pins 42 to 44 and 46, 47 are provided at the periphery of package 30 in a conventional manner to provide connections for bias voltages, while pin 45 provides the output terminal 19 (FIGS. 1, 2) from the oscillator 10. The entire package 30 is then provided with a cover (not shown) and mounting hardware (not shown) to provide a relatively compact, complete oscillator having a frequency substantially invariant with temperature.

Figure 6:
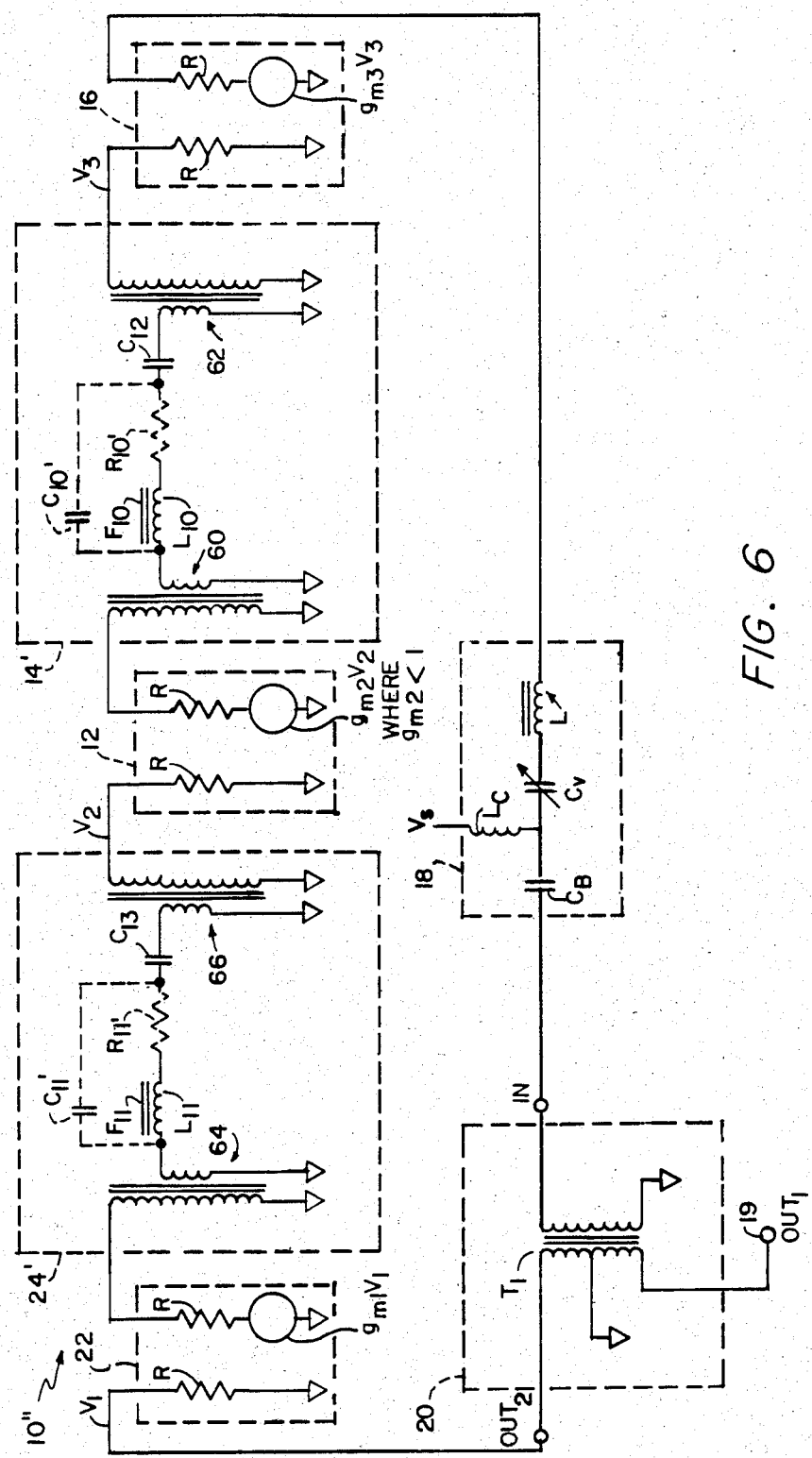
FIG. 6 is an equivalent circuit schematic diagram of the oscillator of FIG. 1 in accordance with an alternate embodiment of the present invention.

Referring now to FIG. 6, a schematic equivalent circuit diagram of an alternate embodiment of an oscillator 10 is shown to include alternate embodiments of temperature compensation phase shift networks 14', 24' coupled between amplifiers 16, 22 and SAW device 12. Amplifier 16, 22 and SAW device 12 here represent the equivalent circuits of the devices as shown in FIG. 1. Temperature compensation phase networks 14' and 24' are substantially identical, and therefore, the discussion of network 14' will suffice for phase shift network 24'.

Temperature compensation phase shift network 14' includes a first transformer 60 having a primary side coupled to the output of the SAW delay line 12 and having a secondary side coupled in series with an inductor $L_{10}$ and a capacitor $C_{12}$ and a secondary side of a second transformer 62. The equivalent circuit of inductor $L_{10}$ includes a parasitic capacitance $C_{10}'$ coupled in shunt with a series combination of the inductor $L_{10}$ and a parasitic resistance $R_{10}'$. Inductor $L_{10}$ also includes a ferrite member $F_{10}$. The second terminal of capacitor $C_{12}$ is coupled to the secondary side of the second transformer 62. The primary side of transformer 62 is coupled to the input of amplifier 16. With this arrangement, an equivalent output impedance of the SAW delay line 12', and the equivalent input impedance of the amplifier 16' are reduced in accordance with the square of the turns ratio between the primary and secondary side of the corresponding transformers 60, 62, as is known in the art.

With this arrangement, the phase angle $\phi'$ is therefore determined by: $\phi' = \tan^{-1}(\Delta L(T)\omega_o)/(2R_{eq}+R')$ where $R_{eq}$ is the equivalent output impedance of amplifier 16 and the equivalent input impedance of SAW delay line 22, as provided by the transformers 60, 62. As an illustration, if the initial impedances are real and equal to 50 ohms each, for example, and if the transformers 60, 62 each provide an impedance transformation of 5:1, then the equivalent resistances $R_{eq}$ of each resistance R is reduced to 10 ohms.

For illustration, with the embodiment shown in FIG. 2, given values of output impedance and input impedance 16 and 20, respectively, of 50 ohms, for example, and $R_1' = 20$, typically the phase angle $\phi$ is given by:

$$\tan^{-1}(\Delta L(T)\omega_o)/(2R+R_1') = \tan^{-1}(\Delta L(T)\omega_o)/120.$$

In comparison, for the embodiment described in conjunction with FIG. 6, $\phi'$ is given by:

$$\tan^{-1}(\Delta L(T)\omega_o/(2R_{eq}+R_1') = \tan^{-1}(\Delta L(T)\omega_o)/40.$$

Thus, use of transformers 60, 62 increases the range of $\phi$ for a given $\Delta L(T)\omega_o$. Thus, with this embodiment, the change in inductance with respect to temperature $(\Delta L(T)\omega_o)$ may be smaller by a factor of 3 than the embodiment of FIG. 2 to provide the same phase angle variation. Therefore, with this arrangement, inductor $L_{10}$ may have a smaller inductance variation as a function of temperature, and therefore, only the single inductor $L_{10}$ is used. This arrangement may be particularly suitable for certain high frequency applications where the parasitic capacitance of individually wound inductors is relatively large and therefore provides, in combination with the parasitic capacitance $C_{10}$, a parallel LC circuit having a resonant frequency which is close to or within the resonant frequency band of the oscillator 10. This arrangement provides a relatively high phase shift characteristic variation as a function of temperature in comparison to a circuit not incorporating the transformers $T_{60}$ and $T_{62}$. As before, the material of magnetic member $F_{10}$ is selected to provide a predetermined inductance variance as a function of temperature and therefore to provide network 14 with a predetermined phase shift variation as a function of temperature to compensate for the phase shift variation of the substrate of the SAW device 12. Here again as described in conjunction with FIGS. 1 and 2, the phase shift network 14 provides high temperature phase compensation. Therefore, the material selected for such high temperature phase compensation is here TT2-113 type ferrite.

Similarly, low temperature phase compensation network 24 includes a pair of transformers 64, 66 and a series connection of an inductor $L_{11}$ and capacitor $C_{13}$ coupled between the secondary sides of each one of the pair of transformers 64, 66. Again, with such an arrangement, the equivalent output impedance of amplifier 22 and input impedance of SAW device 12 are reduced by a factor related to the square of the turns ratio between the primary and secondary sides of the transformers. Again, such an arrangement provides an increased variation of the phase angle $\phi'$ with respect to temperature as described above, for a given $\Delta L(T)\omega_o$. However, here phase shift network 24' provides low temperature phase compensation and therefore the material of garnet member $F_{11}$ is selected to be G1005. The remainder of the oscillator circuit 10 also includes the electronic phase compensation network 18' as described in conjunction with FIG. 2 and the power divider network 20', as described in conjunction with FIG. 2.

Figure 7:
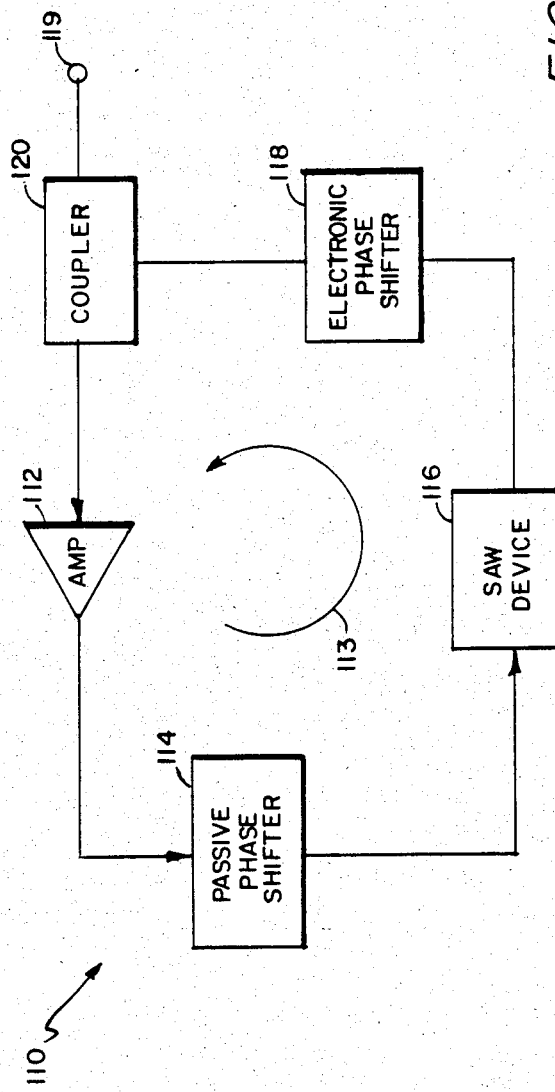
FIG. 7 is a block diagram of an alternate embodiment of an oscillator circuit having a SAW device used as a delay element.

Referring now to FIG. 7, an alternate embodiment of a stable SAW based oscillator 110 is shown to include an amplifier 112 and a feedback loop denoted by an arrow 113 coupled around the amplifier 112. The feedback loop 113 includes a passive phase shifter 114, a SAW device 116, electronic phase shifter 118, and coupler 120. Passive phase shifter 114 here provides a phase shift which varies with respect to temperature in a predetermined manner, here parabolically, to compensate for the phase variation caused by the piezoelectric substrate of the SAW device 116. Here phase shifter 114 provides both high temperature and low temperature compensation for the passive phase shifter in a single network. Electronic phase shifter 18 and coupler 20 are similar to the corresponding circuits described in conjunction with FIG. 1. Amplifier 112 is similar to any one of the amplifiers described in conjunction with FIG. 1, but said amplifier 112 here provides a sufficient amount of gain which exceeds the losses in the feedback loop 113.

Figure 8:
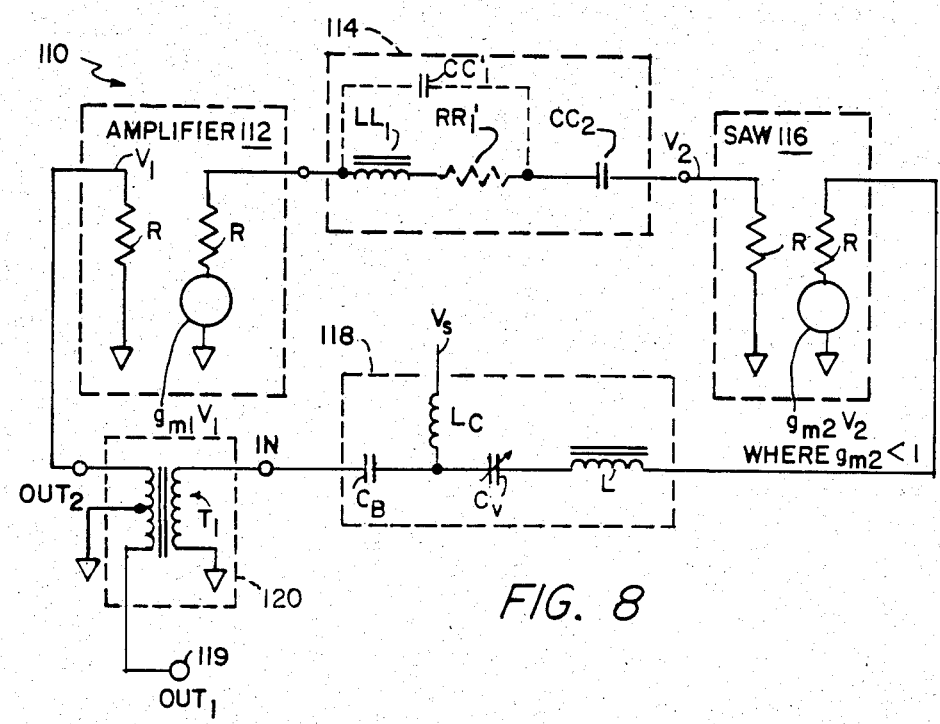
FIG. 8 is an equivalent circuit schematic diagram of an embodiment of the oscillator of FIG. 7.

Referring now to FIG. 8, the equivalent circuit of the oscillator 110 is shown along with that of the passive phase shift network 114. Passive phase shift network 114 is shown to include an inductor $LL_1$ having a parasitic resistance $RR_1'$, a parasitic capacitance $CC_1'$, and a capacitor $CC_2$. Either one or both of the reactive elements $LL_1$ or $CC_2$ are selected to provide a predetermined reactance variation as a function of temperature, and to provide the network 114 with a predetermined phase shift variation as a function of temperature, compensating for the phase variation of the SAW device 116, as described earlier.

In a first embodiment of the invention, the capacitor $CC_2$ is selected to provide a substantially parabolic capacitance variation. Two embodiments of such a capacitor are described in conjunction with FIGS. 10 and 11.

Figure 10:
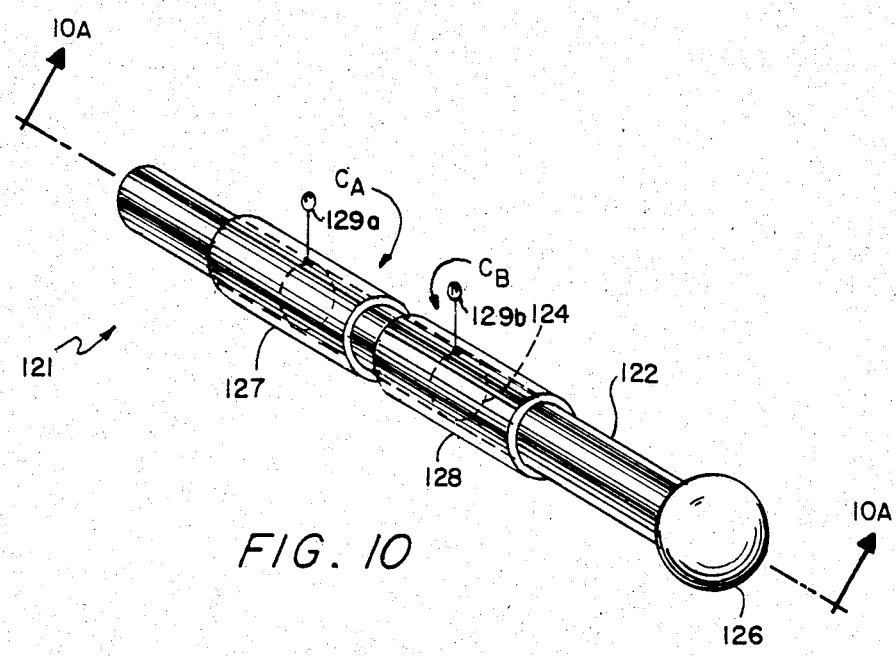
FIG. 10 is an isometric view of a capacitor having a capacitance which varies parabolically as a function of temperature particularly suitable for use in the embodiment of the oscillator shown in FIG. 7.

It can be shown that for a pair of capacitors where the capacitance of a first capacitor increases linearly with temperature of the capacitor, and the capacitance of the second capacitor decreases linearly with the temperature of the capacitor, when said capacitors are connected in series, a composite capacitor is provided having an equivalent capacitance which changes parabolically with temperature.

$$C = \frac{1.11K}{2/n(r_2/r_1)} \cdot l$$

where K is the dielectric constant, and where $r_2$ and $r_1$ are the radii of the inner and outer conductors and $l$ is the overlapping length of the inner conductor with each one of the outer cylinders, as shown in FIG. 10.

If the capacitors are each assumed to have the same initial capacitance $C_o$ (at some temperature, typically the turn-over temperature), and the total capacitance C varies linearly as a function of temperature T (i.e., $l\alpha\Delta T$), then the capacitance of each one of the pair of capacitors may be represented as:

$$(C_o + A\Delta T) \text{ and } (C_o - A\Delta T), \text{ where } A \text{ is } \frac{1.11K}{2/n(r_2/r_1)}$$

The equivalent capacitance $C_T$ of the series combination of a pair of such capacitors is given by:

$$C_T = \frac{1}{\frac{1}{C_o + A\Delta T} + \frac{1}{C_o - A\Delta T}}$$

$$= \frac{(C_o + A\Delta T)(C_o - A\Delta T)}{(C_o + A\Delta T) + (C_o - A\Delta T)} \text{ or}$$

$$C_T = \frac{C_p^2 - (A\Delta T)^2}{2C_o}$$

which has the term $(A\Delta T)^2$, the required parabolic variation.

Figure 10A:
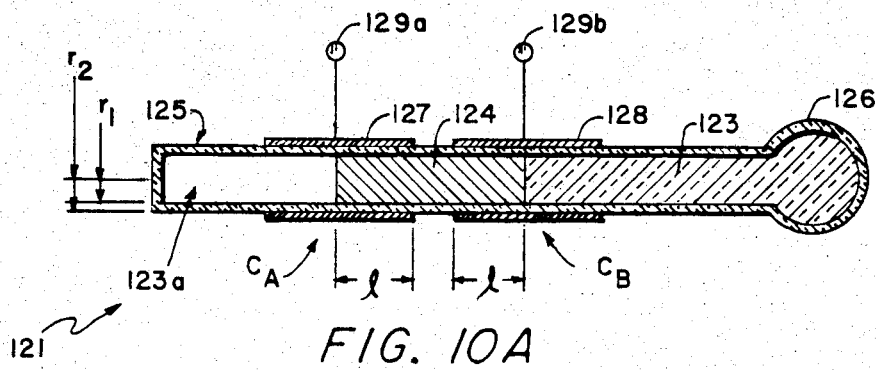
FIG. 10A is a cross-sectional view taken along line 10A—10A of FIG. 10.

Referring now to FIGS. 10 and 10A, a first embodiment suitable for use as capacitor $CC_2$, here element 121, has a capacitance which varies parabolically as a function of temperature is shown to include a reservoir or bulb member 126, here comprised of a glass and which is here integrally formed with a cylindrically elongated tube member 122, here also comprised of glass having a central hollow portion 123a. The second end of tube 122 is closed off also with a glass. Disposed within the reservoir 126 and a first portion of tube member 122 which is coupled to reservoir 126 is an electrically nonconductive fluid such as oil 123. Disposed adjacent said oil 123 is a conducting member 124 or conducting fluid such as mercury. A third portion 125 of tube member 122 is filled with a compressible fluid such as air. The combination of reservoir 126, tube 122, member 124, oil 123 and the air filled portion 125 provide a thermometer type member. In accordance with changes in temperature, conductive member 124 will be displaced towards or away from reservoir 126. Since the tube 122 is terminated at one end in the bulb 126, the motion of the fluid 123 and mercury 124 in the tube is magnified by a factor related to the volume of the bulb 126, as is known. If the coefficient of thermal expansion of the insulating fluid 123 is substantially independent of temperature and significantly greater than the coefficient of thermal expansion of the tube 122, the conductive member 124 will be displaced approximately linearly as a function of temperature. Disposed around the tube 122 are a pair of cylindrical, mutually spaced conductive members 127 and 128, said members 127, 128 being coupled to terminals 129a, 129b, respectively. The conductive members 127, 128 and the dielectric of the tube member 122 and the inner conductor comprised here of the conducting member 124 provide in combination a pair of capacitors $C_A$, $C_B$ which are connected in series through the conductive member 124 between terminals 129a, 129b. In accordance with the temperature to which the capacitor means 121 is exposed, the conductive member 124 will either be displaced towards the reservoir 121 with decreasing temperature or will be displaced towards the outer portion 125 of the tube 123 with increasing temperature as a function of the expansion or contraction of the nonconducting fluid 123. The capacitance of capacitor $C_A$ will vary linearly as a function of temperature, so that, as the temperature increases, the capacitance of capacitor $C_A$ will increase. Conversely, the capacitance of capacitor $C_B$ will vary linearly as a function of temperature, so that, as the temperature increases, the capacitance of capacitor $C_B$ will decrease, and vice versa. As described above, therefore, such an arrangement provides capacitor element 121 with an equivalent capacitance between terminals 129a, 129b having a parabolic variation as a function of temperature. With this arrangement, such a capacitor can be used in the circuit 114 described in conjunction with FIG. 8 for capacitor $CC_1$ and provides in combination with inductor $LL_1$ which has an inductance which is substantially invariant (and whatever variation present is linear) as a function of temperature, a phase shift characteristic to said circuit 114 which is also substantially parabolic. Thus, here inductor $LL_1$ comprises a coiled wire disposed around a nonmagnetic core. With this arrangement, a single circuit 114 is used to provide a quasi-parabolic temperature compensation of the ST-cut quartz material of the SAW delay line, for example.

Figure 11:
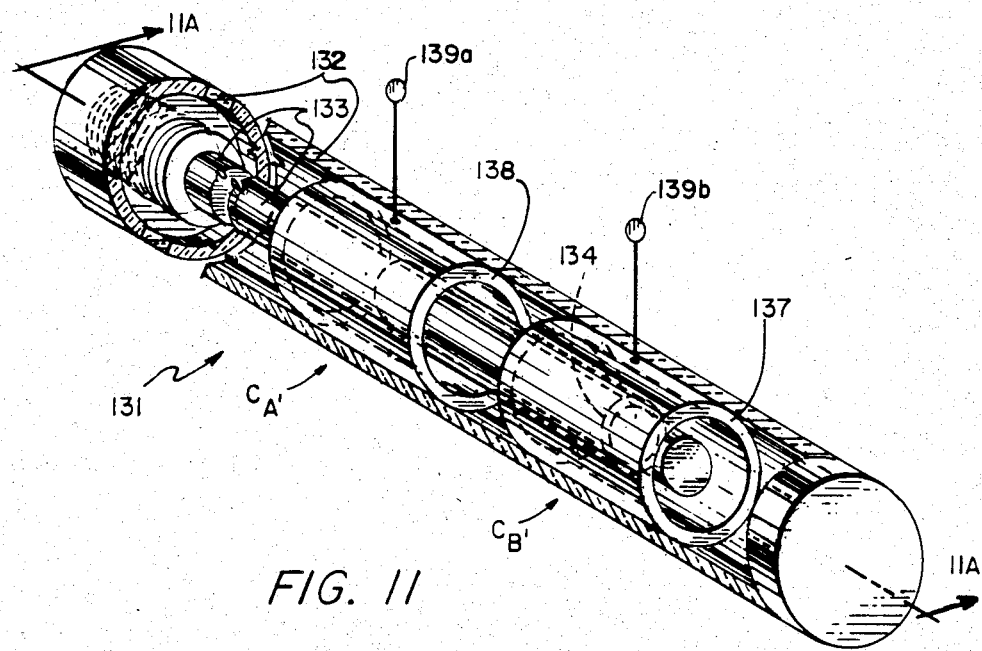
FIG. 11 is an isometric view of an alternate embodiment of a capacitor having a capacitance which varies parabolically as a function of temperature particularly suitable for use in the embodiment of the oscillator shown in FIG. 7.
Figure 11A:
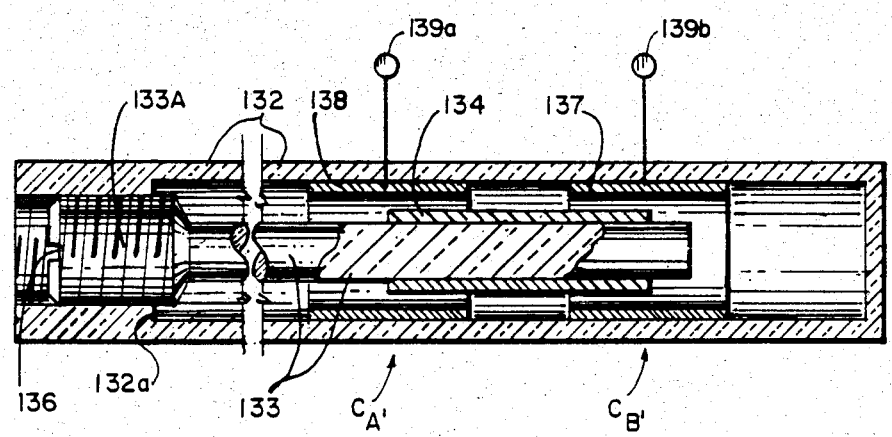
FIG. 11A is a cross-sectional view taken along lines 11A—11A of FIG. 11.

An alternate embodiment of such a capacitor $CC_2$ (FIG. 8) suitable for use in a vibration environment is shown in FIGS. 11 and 11A as a capacitor element 131 and includes a dielectric housing member 132 having affixed on a first inner surface thereof, a pair of cylindrical conductive plate members 137, 138. A third center conductive plate member 134 is axially disposed around and affixed to a rod 133 of a dielectric material having a predetermined coefficient of thermal expansion. In this embodiment, the coefficient of thermal expansion of the material of the rod is selected to be much larger than the coefficient of thermal expansion of the housing 132. A suitable material for the rod 133 is a dielectric plastic such as "Rexolite" and for the housing 132 is a stainless steel or a glass. The rod 133 is threaded at a first end 133a and is supported at the first end 133a by a threaded portion 132a of housing 132. The rod is therefore axially adjustable, via a slot 136, for initial capacitance calibration at some reference temperature (typically the turnover temperature of the material of the piezoelectric substrate of the SAW delay line 12). The third plate 134 and the rod 133 are then coaxially disposed within the inner regions provided by cylindrical plates 137, 138 such that center member 134 is dielectrically spaced, here by air 135, from members 137, 138. With this arrangement, a pair of capacitors $C_A'$, $C_B'$ are provided with center plate 134 providing a series connection between the pair of capacitors $C_A'$, $C_B'$. The position of the common plate 134 changes linearly as a function of temperature such that the value of capacitance of here capacitor $C_B'$ increases linearly as a function of temperature and the capacitance of capacitor $C_A'$ decreases linearly as a function of temperature, and vice versa. Therefore, since said capacitors $C_A'$, $C_B'$ are also connected in series here, via the common plate 134, the total capacitance variation of this arrangement between terminals 139a, 139b again is parabolic as a function of temperature as described above. Thus, capacitor 131 can alternatively be used in the phase shift network 114 described in conjunction with FIG. 8.

Figure 12:
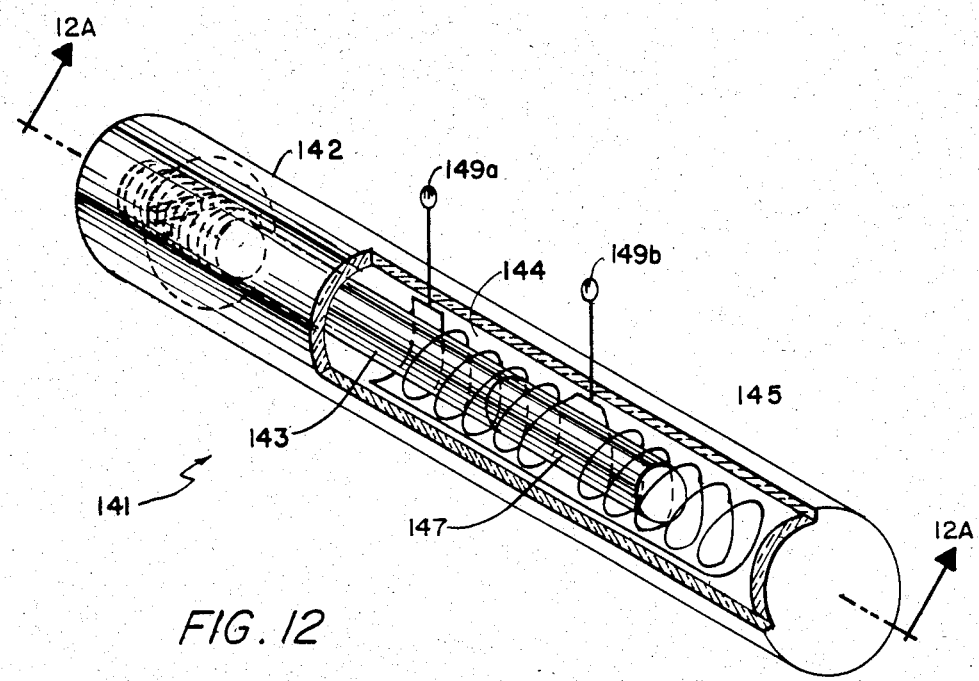
FIG. 12 is an isometric view of an inductor element having an inductance which varies parabolically as a function of temperature particularly suitable for use in the embodiment of the oscillator shown in FIG. 7.
Figure 12A:
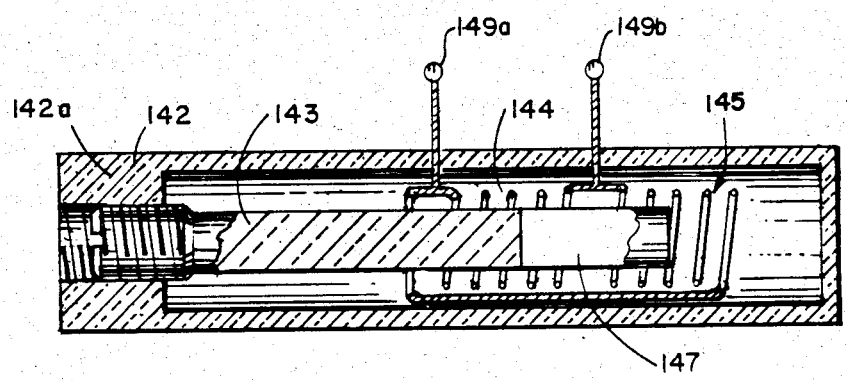
FIG. 12A is a cross-sectional view taken along lines 12A—12A of FIG. 12.

Referring now to FIGS. 12 and 12A, an embodiment for an inductor 141 having an inductance variation which changes parabolically as a function of temperature is shown. The inductor 141 includes a housing 142 here of glass which is spaced via a threaded portion 142a of housing 142 from a center dielectric rod 143, here of "Rexolite", having a predetermined coefficient of thermal expansion. A magnetic member 147 is attached to an end portion of rod 143. The rod 143 and magnetic member 147 are disposed within the field region provided by a pair of coils or solenoids 144 and 145. Solenoids 144, 145 may be freely suspended or preferably wound around a sleeve (not shown) comprised of a nonmagnetic material to give support to the solenoids 144, 145. Magnetic member 147 is axially displaced in accordance with the temperature induced axial displacement of rod 143 through the field regions of coils 144 and 145. Coils 144 and 145 are internally connected in parallel, as shown.

With this arrangement, since the length of the rod 144 is a linear function of temperature, the magnetic member 147 will traverse the field regions enclosed by the solenoids 144, 145 linearly as a function of temperature. The inductance of coil 145 will increase linearly with increasing temperature, and the inductance of coil 144 will decrease linearly with increasing temperature, and vice versa. Therefore, a similar analysis to that described in conjunction with FIGS. 10 and 11 for this arrangement may be carried out to show that the parallel combination of a pair of inductors having an inductance variation given by $(L_o + B\Delta T)$ and $(L_o - B\Delta T)$ will have an inductance variation at terminals 149a, 149b with respect to a temperature which is parabolic. Again, the axial position of member 143 and hence magnetic member 147 are adjustable within the regions of solenoids 144, 145 thus allowing for initial calibration of the inductance of the pair of solenoids 144, 145. Inductor 141 may be used as inductor $LL_1$ in the phase shift network 114 with capacitor $CC_2$ being a conventional capacitor having a reactance which is substantially invariant (and any variation being linear) with temperature to provide the phase shift network 114 with the predetermined phase shift variation as a function of temperature. Here said phase shift variation is substantially parabolic as a function of temperature.

Figure 9:
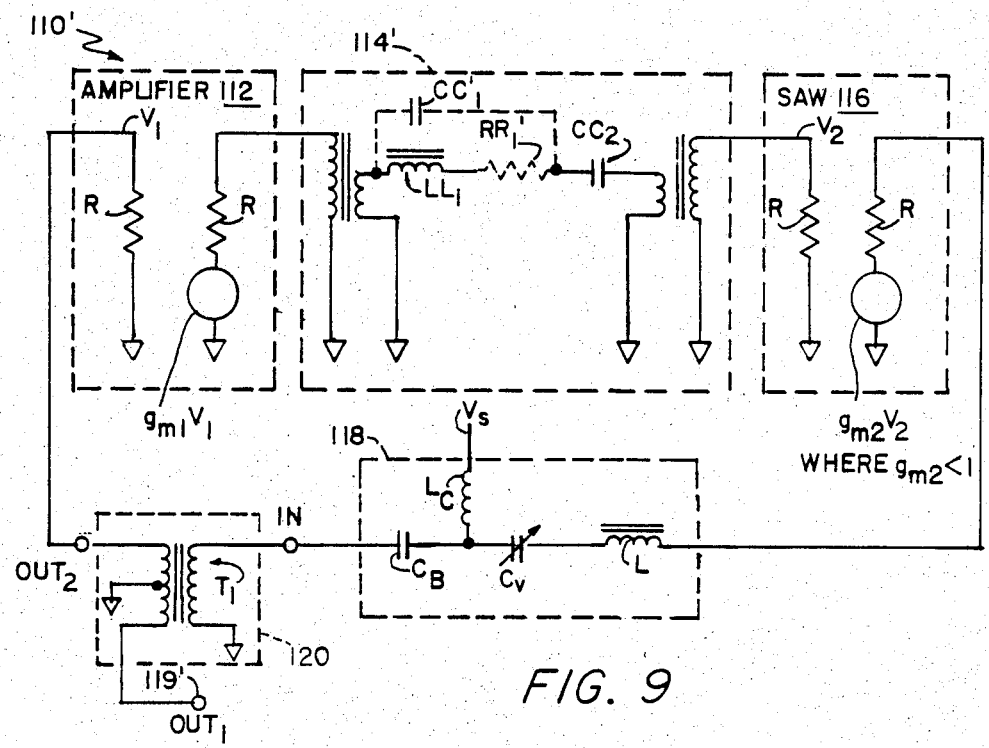
FIG. 9 is a schematic diagram of an alternate embodiment of the oscillator in accordance with the block diagram of FIG. 7.

Referring now to FIG. 9, an alternate embodiment of an oscillator 110' is shown. As was described in conjunction with FIG. 6, transformers, here 160, 162 may be used to reduce or step down the impedance of here the amplifier 112 and SAW device 116. Any one of the embodiments for the parabolic capacitors of FIGS. 10, 11 or inductor of FIG. 12 may be used in conjunction with a conventional opposite type of reactive component to provide network 114" with a substantially parabolic phase shift.

Having described preferred embodiments of the invention, it will now be apparent to one of skill in the art that other embodiments incorporating its concept may be used. For example, the ferrites of inductors $L_1$ to $L_4$ may be replaced by a ferrite member which is a composite of the two described materials TT2-113 and G1005 to provide an inductor whose magnetic permeability and hence reactance varies quasiparabolically with temperature. Further, the plates 127, 128 of capacitor 121 or plates 136, 137 of capacitor 131 may be shaped to provide the respective capacitors with a more complex capacitance variation. It is felt, therefore, that these embodiments should not be restricted to the disclosed embodiments, but rather should be limited only by the spirit and scope of the appended claims.

What is claimed is:

1. In combination:

means for providing a signal having a predetermined amplitude;

means for feeding at least a portion of said signal back to an input of said amplitude means, said feedback means further comprising:

(a) means operative over a predetermined temperature range for providing said signal portion with a a predetermined delay relative to the signal at an output of said amplitude means and a predetermined delay variation over the operative temperature of said delay means, said delay means further comprising:

(i) a substrate comprising ST-cut quartz, said substrate having a surface which supports surface wave propagation and having a surface wave velocity characteristic which varies nonlinearly over said operative temperature range to provide said delay means with the delay variation over said operative temperature range;

(ii) an input transducer and an output transducer, each one being coupled to said surface wave propagating surface, with said signal portion from said amplitude means being fed to the input transducer, and said output transducer providing said signal portion fed to the input of said amplitude means having the predetermined delay and predetermined delay variation (b) means including at least one passive reactive component electrically coupled to said delay means and having a reactance characteristic responsive to the temperature of the delay means, for providing a phase shift variation as a function of temperature to compensate for the delay variations provided to signal fed to the input of said amplitude means to provide said signal fed to the input of said amplitude means with a substantially reduced phase shift variation over the operative temperature range.

2. The combination of claim 1 wherein said delay variation reducing means further comprises at least one inductive element and at least one capacitive element connected in series and coupled to one of said transducers, with at least one of said inductive and capacitive elements having the predetermined reactance variation.

3. The combination of claim 2 wherein said inductive element has the predetermined reactance variation and comprises a magnetic material having a magnetic permeability which varies in a predetermined nonlinear manner over said operative range.

4. The combination of claim 3 wherein said inductive element has the predetermined reactance variation and comprises:
a pair of solenoids;
a magnetic material disposed within portions of said solenoids; and
means for displacing said magnetic material within said solenoids as a function of changes in temperature.

5. The combination of claim 4 wherein said displacing means further comprises a member having a predetermined coefficient of thermal expansion, said member being placed in a cooperative with said magnetic material.

6. The combination of claim 2 wherein said capacitive element has the predetermined reactance variation.

7. The combination of claim 6 wherein said capacitor comprises:
a center conductive member;
a pair of mutually spaced conductive members, each being dielectrically spaced from said center conductive member, and each member arranged to be capacitively coupled to a portion of said center conductive member; and
means for displacing in accordance with variations in temperature a first one of the center conductive member and pair of spaced conductive members with respect to a second one of the center conductive member and pair of spaced conductive members.

8. The combination of claim 7 wherein said displacing means comprises a dielectric having a predetermined coefficient of thermal expansion.

9. The combination of claim 8 wherein said dielectric comprises a fluid having a predetermined coefficient of thermal expansion.

10. The combination of claim 8 wherein said dielectric comprises a member having a predetermined coefficient of thermal expansion.

11. In combination:
a surface acoustic wave device to provide in response to an input signal, an output signal having a first predetermined phase shift and a first predetermined phase shift variation as a function of temperature with respect to the input signal; and
means, disposed to have at least one of said input and output signals coupled therethrough, said means including a passive component having an electrical characteristic which varies as a function of the temperature of the component, for providing a second temperature dependent predetermined phase shift variation to reduce the temperature dependent phase shift variation of said output signal.

12. The combination of claim 11 wherein the passive component is a reactive component and wherein said means for providing a second phase shift variation comprises:
at least one inductive element and at least one capacitive element connected in series with a first one of said input and output transducers, with at least one of said inductive and capacitive elements having the predetermined reactance variation.

13. The combination of claim 12 wherein the inductive element has the predetermined reactance variation.

14. The combination of claim 13 wherein said inductor comprises a magnetic member having a magnetic permeability which varies in a predetermined manner as a function of temperature to provide said predetermined reactance variation.

15. The combination of claim 13 wherein said inductor comprises:
a pair of solenoids;
a magnetic material disposed within portions of said solenoids; and
means for displacing said magnetic material within said solenoids as a function of changes in temperature.

16. The combination of claim 15 wherein said displacing means comprises a member having a predetermined coefficient of thermal expansion, said member being placed in a cooperative relationship with said magnetic material.

17. The combination of claim 12 wherein passive element is a capacitor said capacitor element has the predetermined reactance variation.

18. The combination of claim 17 wherein said capacitor comprises:
a center conductive member;
a pair of mutually spaced conductive members, each being dielectrically spaced from said center conductive member, and each member arranged to be capacitively coupled to a portion of said center conductive member; and
means for displacing in accordance with variations in temperature a first one of the center conductive member and pair of spaced conductive members with respect to a second one of the center conductive member and pair of spaced conductive members.

19. The combination of claim 18 wherein said displacing means comprises a dielectric having a predetermined coefficient of thermal expansion.

20. The combination of claim 19 wherein said dielectric comprises a fluid having a predetermined coefficient of thermal expansion.

21. The combination of claim 19 wherein said dielectric comprises a member having a predetermined coefficient of thermal expansion.

22. An oscillator comprising:
(a) means for providing a signal at an output thereof having a predetermined amplitude;
(b) means for feeding at least a portion of said signal back to an input of said amplitude means, said feedback means comprising:
(i) means for providing a predetermined phase shift characteristic to said signal fed to the input of the amplitude means relative to the phase of the signal provided from the output of the amplitude means comprising:
(a) means for supporting surface wave propagation having a surface wave velocity characteristic which varies in a first predetermined manner as a function of temperature;
(b) input and output transducers, each coupled to said surface wave propagation means;
(c) wherein said signal is fed to the input transducer and received at the output transducer and is provided with a predetermined phase shift and a predetermined phase shift temperature dependent variation in accordance with the surface wave velocity characteristic and temperature dependent variation in surface wave velocity of the surface wave support means;
(ii) means, including at least one passive reactive element having a predetermined reactance variation as a function of the temperature of the element, and disposed to react to the temperature of the phase shift means for providing, said signal with a substantially invariant delay variation as a function of temperature.

23. The combination of claim 22 wherein said passive reactive element is an inductor.

24. The combination of claim 23 wherein said inductor comprises a magnetic member having a magnetic permeability which varies in a predetermined manner as a function of temperature to provide the predetermined reactance variation.

25. The combination of claim 23 wherein said inductor comprises:
a pair of solenoids;
a magnetic material disposed within portions of said solenoids; and
means for displacing said magnetic material within said solenoids as a function of changes in temperature.

26. The combination of claim 25 wherein said displacing means comprises a member having a predetermined coefficient of thermal expansion, said member being placed in a cooperative relationship with said magnetic material.

27. The combination of claim 22 wherein said passive element is a capacitor.

28. The combination of claim 27 wherein said capacitor comprises:
a center conductive member;
a pair of mutually spaced conductive members, each being dielectrically spaced from said center conductive member, and each member arranged to be capacitively coupled to a portion of said center conductive member; and
means for displacing in accordance with variations in temperature a first one of the center conductive member and pair of spaced conductive members with respect to a second one of the center conductive member and pair of spaced conductive members.

29. The combination of claim 28 wherein said displacing means comprises a dielectric having a predetermined coefficient of thermal expansion.

30. The combination of claim 29 wherein said dielectric comprises a fluid having a predetermined coefficient of thermal expansion.

31. The combination of claim 29 wherein said dielectric comprises a member having a predetermined coefficient of thermal expansion.

32. A delay element comprising:
means, operative over a predetermined temperature range, for providing an output signal having a predetermined, nominal delay with respect to an input signal fed to an input of the delay means, such delay varying from such nominal delay over the predetermined operating temperature range of the delay means, said means further comprising:
(i) means for supporting surface wave propagation having a surface wave velocity characteristic which varies in a predetermined manner over said temperature range;
(ii) an input transducer fed by the input signal and an output transducer providing said output signal, said transducers each being coupled to said surface wave propagation means;
means, including an electrical component having a temperature dependent electrical characteristic and disposed to have the temperature dependent electrical characteristic thereof respond to the operative temperature of the delay means, said electrical component being electrically coupled to the delay means, for providing a temperature compensating delay to the signal fed to the delay element, such signal passing through the delay means and the electrical component of the temperature compensating delay means, such compensating delay varying with the temperature dependent electrical characteristic of the electrical component to provide the delay element with a substantially temperature invariant delay characteristic over the predetermined operating range.

33. The combination of claim 32 wherein said electrical component is an inductor.

34. The combination of claim 33 wherein said inductor comprises a magnetic member having a magnetic permeability which varies in a predetermined manner as a function of temperature.

35. The combination of claim 33 wherein said inductor comprises:
a pair of solenoids fed by the signal passing through the temperature compensating means;
a magnetic material disposed within portions of the magnetic fields provided in response to said signal fed to said solenoids; and
means for displacing said magnetic material within said solenoids as a function of changes in temperature.

36. The combination of claim 35 wherein said displacing means comprises a member having a predetermined coefficient of thermal expansion, said member being placed in a cooperative relationship with said magnetic material.

37. The combination of claim 32 wherein said electrical component is a capacitor.

38. The combination of claim 37 wherein said capacitor comprises:
a center conductive member;
a pair of mutually spaced conductive members, each being dielectrically spaced from said center conductive member, and each member arranged to be capacitively coupled to a portion of said center conductive member; and
means for displacing in accordance with variations in temperature a first one of the center conductive member and pair of spaced conductive members with respect to a second one of the center conductive member and pair of spaced conductive members.

39. The combination of claim 38 wherein said displacing means comprises a dielectric having a predetermined coefficient of thermal expansion.

40. The combination of claim 39 wherein said dielectric comprises a fluid having a predetermined coefficient of thermal expansion.

41. The combination of claim 39 wherein said dielectric comprises a member having a predetermined coefficient of thermal expansion.

42. An inductor comprising:
a pair of solenoids connected in parallel;
a body comprised of a magnetic material disposed within portions of each of said solenoids; and
means for displacing said magnetic material within said solenoids as a function of changes in temperature to provide said inductor with a parabolic inductance variation in accordance with said changes in temperature.

43. The combination of claim 42 wherein said displacing means comprises a member having a predetermined coefficient of thermal expansion, said member being placed in a cooperative relationship with said magnetic material.

44. A capactior comprising:
a center conductive member;

a pair of mutually spaced conductive members, coaxially disposed around and each being dielectrically spaced from said center conductive member, and each member arranged to be capacitively coupled to a portion of said center conductive member; and means for displacing in an axial direction in accordance with variations in temperature a first one of the center conductive member and pair of spaced conductive members with respect to a second one of the center conductive member and pair of spaced conductive members.

45. The combination of claim 44 wherein said displacing means comprises a dielectric having a predetermined coefficient of thermal expansion and said center conductor is disposed around said dielectric.

46. The combination of claim 44 wherein said means for displacing comprises a fluid having a predetermined coefficient of thermal expansion.

47. The combination of claim 45 wherein said dielectric comprises a member having a predetermined coefficient of thermal expansion.

* * * * *